Figure 1:
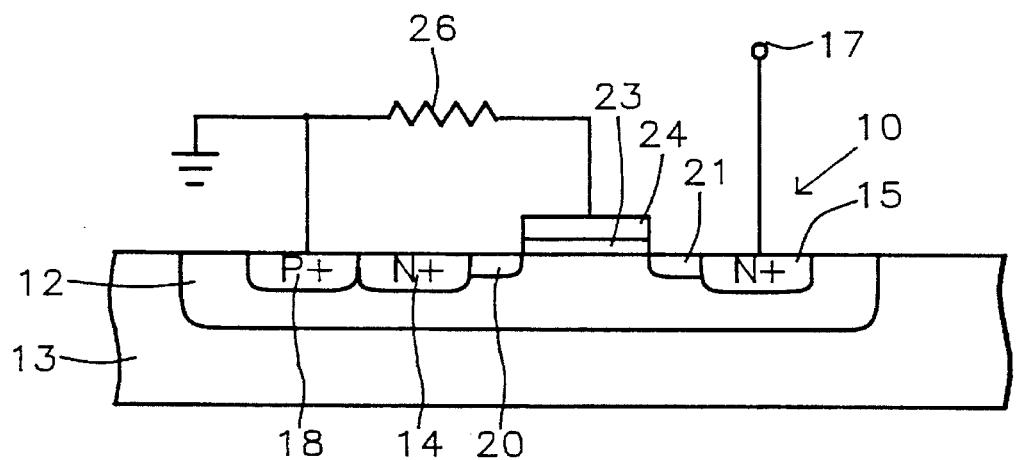

United States Patent [19]
Lee

[11] Patent Number: 5,563,525
[45] Date of Patent: Oct. 8, 1996

[54] ESD PROTECTION DEVICE WITH FET CIRCUIT

[75] Inventor: Jian-Hsing Lee, Hsin-chu, Taiwan

[73] Assignee: Taiwan Semiconductor Manufacturing Company Ltd, Hsin-chu, Taiwan

[21] Appl. No.: 387,083

[22] Filed: Feb. 13, 1995

[51] Int. Cl.$^6$ .............................. H02H 9/04; H01L 23/62
[52] U.S. Cl. .................. 326/30; 361/56; 361/91; 361/212; 257/360
[58] Field of Search ................ 361/56, 91, 111, 361/118, 212; 257/358, 359, 360; 326/9, 21, 23, 30

[56] References Cited

U.S. PATENT DOCUMENTS

| | | | |
|---|---|---|---|
| 3,667,009 | 5/1972 | Rugg | 317/235 |
| 3,746,946 | 7/1973 | Clark | 257/360 |
| 3,777,216 | 12/1973 | Armstrong | 257/360 |
| 3,819,952 | 6/1974 | Enomoto et al. | 257/360 |
| 4,143,391 | 3/1979 | Suzuki et al. | 357/44 |
| 4,423,431 | 12/1983 | Sasaki | 361/56 |
| 4,527,213 | 7/1985 | Ariizumi | 361/56 |
| 5,157,573 | 10/1992 | Lee et al. | 361/56 |
| 5,212,618 | 5/1993 | O'Neill et al. | 361/56 |
| 5,270,265 | 12/1993 | Lee et al. | 257/358 |
| 5,477,407 | 12/1995 | Kobayashi et al. | 361/91 |

OTHER PUBLICATIONS

Weste et al.; "Principles of CMOS VLSI Design, A Systems Perspective", ©1985, by AT&T Bell Laboratories and Kamran Eshraghian; p. 59.
Weste et al.; "Principles of CMOS VLSI Design, A Systems Perspective"; © 1985 by AT&T Bell Laboratorires, Inc. and Kamran Eshraghian; p. 58.

*Primary Examiner*—Edward P. Westin
*Assistant Examiner*—Benjamin D. Driscoll
*Attorney, Agent, or Firm*—George O. Saile; William S. Robertson

[57] ABSTRACT

An FET is connected between ground and a pad to be protected from an ESD voltage, and when an ESD voltage appears at the pad the drain-channel junction breaks down and produces hole-electron pairs that turn on a parasitic bipolar transistor which clamps the voltage at the pad. A resistor connects the gate of the FET to ground. As the ESD voltage rises at the pad, the gate to drain capacitance charges in circuit with the resistor. The voltage across the gate oxide rises slowly enough that the FET is enabled to produce hole-electron pairs for turning on the bipolar transistor before the oxide voltage has reached a value that might damage the gate oxide.

11 Claims, 1 Drawing Sheet

ESD PROTECTION DEVICE WITH FET CIRCUIT

FIELD OF THE INVENTION

This invention relates to semiconductor circuits and structures. More specifically it relates to a circuit for protecting a pad of a semiconductor device and operating circuits connected to the pad from voltages of an electrostatic discharge (ESD).

INTRODUCTION—ESD PROTECTION

Protection against ESD voltages is a familiar problem in the design of semiconductor devices. When an ESD voltage appears at an input/output pad of a semiconductor chip, it can damage the operating circuits that are connected to the pad. Some chips have a resistor connected in the signal path between the pad and the operating circuits, and it will be convenient to refer to the node where the resistor and the operating circuits are connected as the protected node to distinguish it from the pad, which is also protected by these circuits.

When there is no voltage at the pad or the voltage is in the range of normal signal voltages, the ESD protection circuits are inactive and do not influence the operating circuits of the chip. When the pad voltage is in the polarity of normal signal voltages but above the normal range, the protection circuits turn on and clamp the voltage at the pad and thereby protect the operating circuits from a damaging voltage.

When a high voltage of the opposite polarity appears at the pad, the components can be protected in various ways. For example, junctions associated with the pad or the circuits to be protected may become forward biased and clamp the pad voltage.

THE PRIOR ART

It will simplify the explanation to describe an NMOS FET with N+ diffusions for the source and drain and a channel formed in a p-well in an n-type substrate. The prior art has suggested connecting an FET at the protected node with the drain connected to the protected node and the source connected to ground. The gate electrode is connected to the source, and the drain-channel junction forms a reverse biased diode.

In this prior art circuit, the gate is connected to ground. Commonly this connection is made by extending the material of the gate electrode to the source diffusion.

When normal signal voltages appear at the drain diffusion, the FET is turned off and does not affect the circuit operation. At a predetermined voltage associated with an ESD event, the FET turns on and clamps the voltage at the protected node. The turn-on operation begins with oxide breakdown of the drain-to-gate overlap region, then avalanche breakdown of the drain-channel junction, and limit the ESD voltage.

These FETs have a parasitic bipolar transistor. The source of the FET forms the emitter of the bipolar, the region between drain to source forms the baseband the drain forms the collector. When electron-hole pairs are created by avalanche breakdown, the holes forward-bias the base-emitter junction and the parasitic bipolar transistor turns on.

SUMMARY OF THE INVENTION

A problem occurs in theses circuits that may destroy the protection circuit. The ESD voltage appears as a rising pulse and this pulse continues to rise after it has reached a value to initiate avalanche break-down but before the FET has generated enough hole-electron pairs to turn on the parasitic bipolar transistor. A high power product P= I oxide-break×V avalanche would exist at the gate oxide and this might cause the gate oxide thermal run away if we don't limit the I oxide.

In the protection circuit of this invention, a resistor interconnects the gate electrode of the FET and ground. At the beginning of an ESD event, there is no current in this circuit (and no voltage drop between the gate electrode end of the resistor and the ground end of the resistor) and the gate electrode is at ground, as in the operation of the prior art protection device. After oxide breakdown, the oxide breakdown current is limited by the series resistor and it reduce the voltage difference between drain to gate and thereby reduces the power product and prevents gate oxide damage.

Other objects and features of the invention will be evident in the description of a preferred embodiment of the invention.

THE DRAWING

FIG. 1 is an edge view of a semiconductor structure showing the ESD protection device of this invention.

THE PREFERRED EMBODIMENT

The Preferred Structure—FIG. 1

The FET protection device 10 of this invention is shown as a semiconductor structure of FIG. 1 is formed in a p-well 12 in an n-type substrate 13 (or in a p-type substrate). An N$^+$ diffusion 14 is formed for a source and an N$^+$ diffusion 15 is formed for a drain. Drain diffusion 15 is connected to the protected node 17. A P$^+$ diffusion 8 provides a point for connecting the source to ground. The connections of the drain and source are conventional and is shown schematically.

Associated N$^-$ diffusions 20 and 21 are formed to produce a lightly doped drain structure. These lightly doped diffusions make the device more susceptible to ESD voltages because they are shallow and are therefore easily damaged by ESD voltages. However, the protection circuit is useful with conventionally formed (only N$^+$) diffusions. The FET also has a layer of gate oxide 23 and a gate electrode 24.

According to this invention, a resistor 26 is connected between the gate electrode 24 and ground. The significance of the resistor will be apparent from the explanation of the operation of the circuit. The resistor has a suitable value for the operation that will be described and is preferably about 200 ohms. The resistor can be formed in any suitable way. For example, wiring on the surface of the device can connect the gate electrode 24 to a region of the p-well 12 or substrate 13 that forms a path to any suitable ground connection such as diffusion 18. In this example, the resistor is formed in the semiconductor device.

OPERATION

The circuit path through these components and can be traced from the source diffusion 14 to the drain diffusion 15 (The direction is arbitrary.) The path through the source diffusion 14 and the associated N$^-$ diffusion 20 can be considered to be a resistor. A capacitor couples the source diffusions to the gate. The gate is a low resistance conductor and can be assumed to have the same potential at every point. Resistor 26 forms a parallel connection between ground and the gate electrode.

The circuit device of FIG. 1 has been compared with a similar device without resistor 26. The voltage rises similarly for both devices and the oxide breakdown begins at comparable voltages. Before the device goes into snap-back from avalanche breakdown, the oxide breaks down and current flows in the circuit of the oxide 23, the gate electrode 24 and the resistor 26. Resistor 26 limits the power in the oxide 23 and prevents its damage. Then the device goes into snapback and the voltage is clamped at a level that does not harm the oxide.

SUMMARY

From the description of a preferred embodiment of the invention, those skilled in the art will variations within the spirit of the invention and the intended scope of the claims.

I claim:

1. An ESD protection circuit for a semiconductor device of the type having a pad (17) and a circuit connected to the pad, the circuit being subject to an ESD voltage that may appear at the pad, the protection circuit comprising, an FET (10) having a drain diffusion (15) connected to the pad, a source diffusion (14) connected to circuit ground, a channel connecting the source and drain diffusions, a gate oxide layer (23) overlying the channel, and a gate electrode (24) overlying the oxide layer, the FET operating as a bipolar transistor when charge carriers are created by avalanche breakdown associated with an ESD voltage, the gate oxide layer being subject to dielectric break down and a resulting current flow in response to an ESD voltage, and a resistor (26) connecting the gate electrode to ground to conduct a current associated with gate oxide break down, the resistor having a sufficiently high value to limit the oxide break down current to a low value during the initiation of avalanche breakdown of the drain-channel junction of the FET to prevent damage to the gate oxide.

2. The circuit of claim 1 wherein the resistor (26) has a sufficiently low value to keep the FET turned off while normal operating voltages are on the pad.

3. The ESD protection circuit of claim 1 wherein the resistor has a value to limit current in the gate oxide during gate oxide breakdown and before avalanche breakdown to prevent damage to the gate oxide.

4. The circuit of claim 3 wherein the resistor (26) is formed in the semiconductor device.

5. The ESD protection circuit of claim 3 wherein the resistor has a value of about 200 ohms.

6. The ESD protection circuit of claim 3 wherein the resistor is connected to the gate electrode by a conductor formed on the surface of the semiconductor device.

7. The ESD protection circuit of claim 6 wherein the resistor is formed in the semiconductor device.

8. The circuit of claim 6 wherein the circuit has a diffusion (18) of the opposite conductivity type as its source diffusion (14) and means connecting the diffusion of opposite conductivity type to ground, said diffusion of the opposite conductivity type forming a junction with the source diffusion for grounding the source diffusion, and wherein the resistor (26) connecting the gate electrode is connected to ground with the diffusion.

9. The circuit of claim 8 wherein the resistor (26) is connected to the gate electrode by wiring on the surface of the semiconductor device.

10. The circuit of claim 9 wherein the resistor (26) is connected to ground by wiring on the surface of the semiconductor device.

11. The circuit of claim 4 wherein the transistor (10) is formed in a well in a semiconductor structure and the resistor is formed in the well.

* * * * *